United States Patent [19]

Tran

[11] Patent Number: 5,047,670
[45] Date of Patent: * Sep. 10, 1991

[54] BICMOS TTL INPUT BUFFER

[75] Inventor: Hiep V. Tran, Carrollton, Tex.

[73] Assignee: Texas Instruments Incorporated, Dallas, Tex.

[*] Notice: The portion of the term of this patent subsequent to Feb. 20, 2007 has been disclaimed.

[21] Appl. No.: 587,482

[22] Filed: Sep. 6, 1990

Related U.S. Application Data

[63] Continuation of Ser. No. 427,150, Oct. 25, 1989, abandoned, which is a continuation of Ser. No. 198,276, May 25, 1988, Pat. No. 4,902,915.

[51] Int. Cl.[5] .............................. H03K 17/04
[52] U.S. Cl. .................................. 307/475; 307/446; 307/491
[58] Field of Search ............... 307/443, 446, 451, 475, 307/491, 495, 362, 570, 310

[56] References Cited

U.S. PATENT DOCUMENTS 4,430,582  2/1984  Bose et al. ...................... 307/475 X Primary Examiner—David Hudspeth
Attorney, Agent, or Firm—Stanton C. Braden; James T. Comfort; Melvin Sharp

[57] ABSTRACT

A threshold control BiCMOS TTL input buffer is disclosed which substantially eliminates input trip point variation across power supply, process, and temperature and additionally minimizes buffer power dissipation.

3 Claims, 4 Drawing Sheets

BICMOS TTL INPUT BUFFER

This application is a continuation of application Ser. No. 07/427,150, filed 10/25/89 now abandoned, which is a continuation of application Ser. No. 07/198,276, filed 05/25/88, now U.S. Pat. No. 4,902,915.

BACKGROUND OF THE INVENTION

The asynchronous operation CMOS TTL (complementary metal oxide semiconductor transistor-transistor logic) input buffer has two major obstacles that have been taunting IC (integrated circuit) designers for years. The first obstacle is the variation of input trip point (the point beyond which an output responds to a change in an input) across power supply, process and temperature. The second obstacle is the high power dissipation of the buffer's first stage inverter, which results from the small voltage swing of the TTL input level. Furthermore, for compatibility to standby power requirements of the existing products, a CMOS input buffer often must be gated by an enabling signal for switching to and from the standby mode (a mode of wherein the buffer is not operational and thus shut off to conserve power). A typical prior art CMOS input buffer is shown in FIG. 1 wherein an enable signal and an input signal are inputs to nor gate 3 which feeds first stage inverter 5 which in turn feeds second stage inverter 7. These problems require compromises to be made between speed, power, yield and reliability, and thus tend to degrade the overall performance of the device. FIG. 2 shows a plot of DC trip point vs. buffer supply voltage Vcc for the prior art CMOS input buffer shown in FIG. 1. TTL VIH represents a TTL high level while TTL VIL represents a TTL low level. The transistor sizes of the buffer's first stage inverter are chosen such that the DC trip point is centered at a midpoint of the TTL input level (1.4 volts). However, as shown in FIG. 2, as process, power supply and temperature fluctuate, the DC trip point deviates away from the midpoint and reduces the input signal margins. Additionally, a significant current is flowing through nor gate 3 of the CMOS input buffer of FIG. 1 when its input is at the TTL VIH level of 2.0 volts, resulting in much undesired power dissipation. FIG. 3 shows a plot of this current vs. input voltage VIN into the buffer.

OBJECTS OF THE INVENTION

It is an object of the invention to provide a new and improved input buffer.

It is an object of the invention to provide a new and improved input buffer which has a stable trip point across power supply, process and temperature variations.

It is an object of the invention to provide a new and improved input buffer with decreased power dissipation.

These and other objects of the invention, together with the features and advantages thereof, will become apparent from the following detailed specification when read together with the accompanying drawings in which applicable reference numerals have been carried forward.

SUMMARY OF THE INVENTION

The foregoing objects of the invention are achieved by a threshold control (TCON) BiCMOS (bipolar-CMOS) TTL input buffer which substantially eliminates the previously discussed problems associated with the CMOS input buffer. The invention includes a threshold inverter, which includes field effect transistors, and an operational amplifier configured as a unity gain voltage follower. The inverting input of the operational amplifier is connected to the input of the threshold inverter and the threshold inverter's input is tied to its output. The non-inverting input of the operational amplifier is connected to a stable voltage source, a band-gap reference circuit. A first stage inverter, connected to the input of the buffer, including substantially identically sized field effect transistors as the threshold inverter, is connected to the threshold inverter so as to mirror selected voltages of the threshold inverter to the first stage inverter and set the first stage inverter's trip point. By selecting the sizes of the first stage inverter's transistors such that the gate to source voltages of a selected transistor from the first stage inverter is always below a predetermined voltage level, DC input buffer current through the first stage inverter can be substantially decreased, thereby resulting in decreased power dissipation.

DETAILED DESCRIPTION OF THE INVENTION

Figure 4:
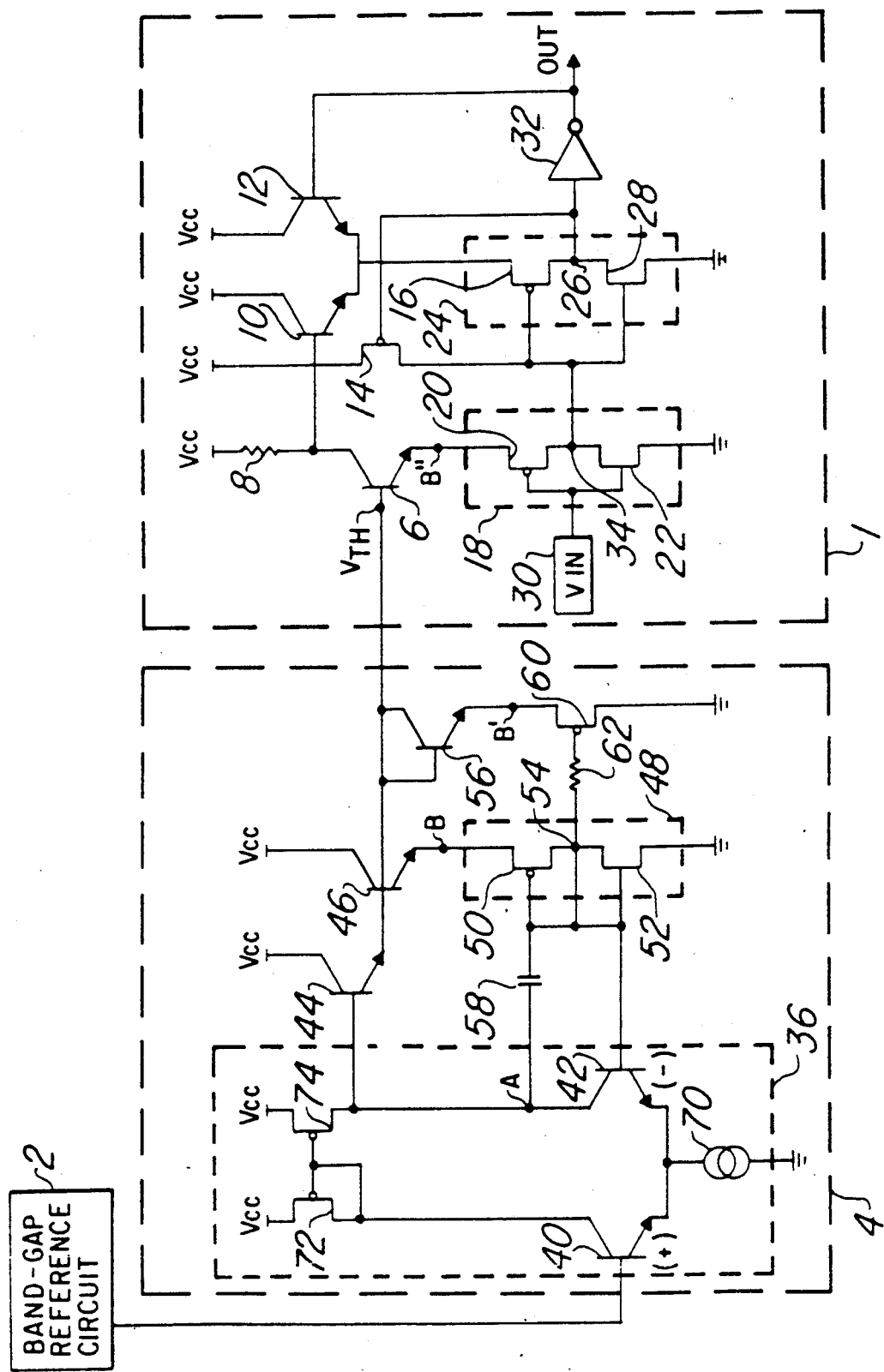
FIG. 4 is a schematic drawing illustrating a preferred embodiment of the invention.

The preferred embodiment of the threshold control BiCMOS TTL input buffer is illustrated in FIG. 4 comprises input buffer sub-circuit 1 connected to threshold reference circuit 4 which is connected to band-gap reference circuit 2.

Input buffer sub-circuit 1 comprises the following elements and associations among elements stated below. First stage CMOS inverter 18 includes p-channel transistor 20 and n-channel transistor 22. Vin input 30 is connected to inverter 18 through the gates of transistors 20 and 22. Output node 34 of inverter 18 is connected to second stage CMOS inverter 24 through the gates of inverter 24's p-channel transistor 16 and n-channel transistor 28. The sources of transistors 22 and 28 are at circuit ground potential. The source of transistor 20 is connected to the emitter of bipolar transistor 6 and the source of transistor 16 is connected to the emitter of emitter coupled bipolar paired transistors 10 and 12. The collector of transistor 6 is connected to the base of transistor 10. Resistor 8 is connected across Circuit supply voltage Vcc and the base of transistor 10. Inverter 32 is connected between output 26 of inverter 24 and the base of transistor 12. The gate of p-channel transistor 14 is connected to the input of inverter 32 while its source is at circuit supply voltage Vcc and its drain is connected to the gate of transistor 28.

Threshold reference circuit 4 comprises the following as stated below. Operational amplifier (op amp) 36 comprises constant current source 70, emitter coupled bipolar paired transistors 40 and 42, and gate coupled paired p-channel transistors 72 and 74 with transistor 72 being configured as a diode. The collector of transistor 40 is connected to the drain of transistor 72 and the collector of transistor 42 is connected to the drain of transistor 74. Constant current source 70 is connected to the emitters of transistors 40 and 42. The base of transistor 40 serves as the non-inverting input (+) to op amp 36 while the base of transistor 42 serves as the inverting input (−) to op amp 36. Node A which is located between the drain of transistor 74 and the collector of transistor 42 is connected to pole splitting capacitor 58 and the base of bipolar transistor 44. Transistor 44 and 46 comprise a darlington configured pair with the emitter of transistor 44 connected to the base of transistor 46. Both collectors of transistors 44 and 46 are at Vcc potential. The emitter of transistor 46 is connected to the source of p-channel transistor 50 which together with n-channel transistor 52 comprise inverter 48. Output 54 of inverter 48 is tied to its input and therefore tied to inverting input (−). Pole splitting capacitor 58 is connected between node A and the gate of transistor 50. Resistor 62 is connected between output 54 and the gate of p-channel transistor 60. The source of p-channel transistor 60 is connected to the emitter of bipolar transistor 56. Bipolar transistor 56 is configured as a diode with its base common with the base of transistor 46 and its collector and base connected to transistor 6 of input buffer sub-circuit 1. Non-inverting input (+) is connected to band -gap reference 2.

Figure 5:
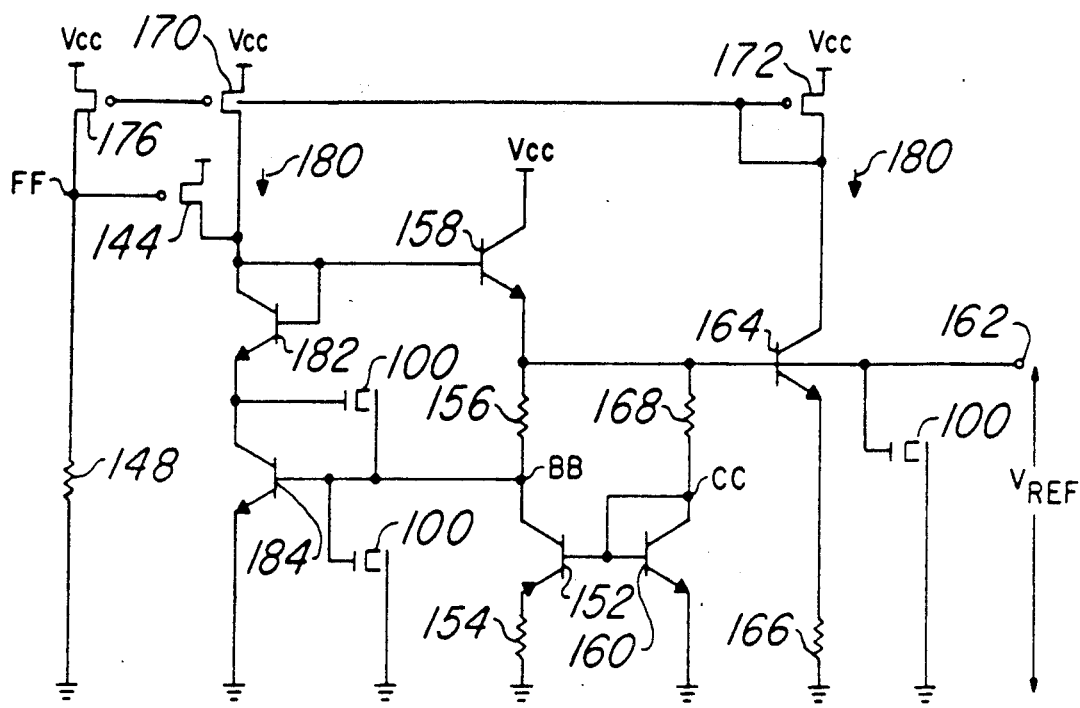
FIG. 5 is a schematic drawing illustrating a band-gap reference voltage circuit.

Band-gap reference circuit 2 comprises the following elements and their associations. FIG. 5 is a schematic drawing of BiCMOS band-gap reference voltage circuit 2. Bipolar transistors 152, 158 and 160 comprise a band-gap sub-circuit. Transistors 152 and 160 share a common base with transistor 160 in a diode configuration such that its collector is tied to its base. The collector of transistor 152 is connected at node BB to resistor 156 and the collector of transistor 160 is connected at node CC to resistor 168. Both resistors 156 and 168 are connected together and to the emitter of transistor 158. Resistor 154 is connected to the emitter of transistor 152 and ground. The collector of transistor 158 is tied to voltage Vcc. P-channel transistors 170 and 172 share a common gate and comprise a current mirror. Transistor 172 is shown with its drain tied to its gate. P-channel transistors 144, and 176 comprise start-up circuitry for starting the operation of the reference voltage circuit. Transistor 176 shares its gate with transistor 170 and has its drain connected at node FF to the gate of transistor 144. Resistor 148 is connected between node FF and ground. Voltage regulator circuitry comprises bipolar transistors 182 and 184. Transistors 182 is connected in a diode configuration with its base tied to its collector. The emitter of transistor 182 is connected to the collector of bipolar transistor 184. The emitter of bipolar transistor 184 is connected to ground while its base is connected to the collector of transistor 152. Means for establishing a reference voltage for the circuit comprises bipolar transistor 164 with its base connected to the emitter of transistor 158 and its collector tied to the drain and gate of transistor 172. The emitter of transistor 164 is connected to resistor 166 which is connected to circuit ground. A reference voltage is established at output 162 which is the base of transistor 164.

Figure 1:
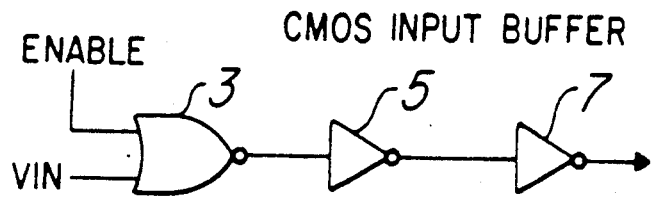
FIG. 1 is a schematic drawing illustrating a prior art CMOS input buffer.
Figure 2:
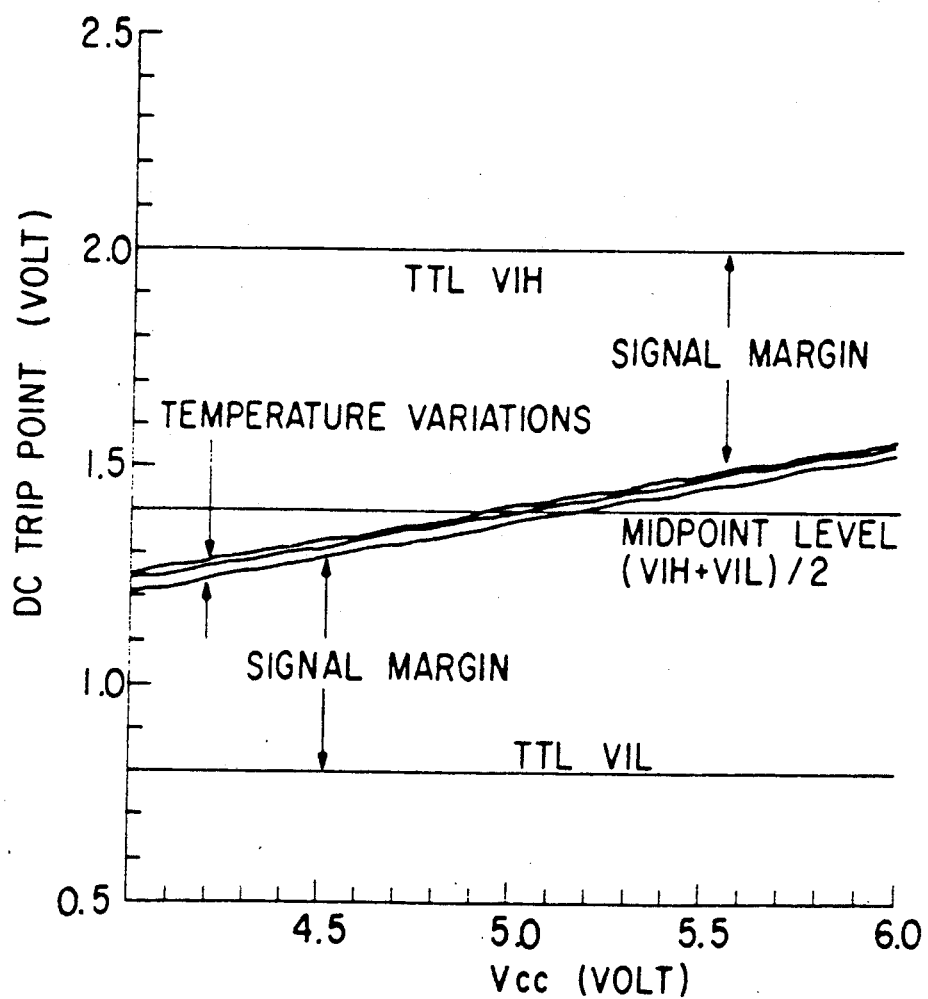
FIG. 2 is a plot of DC trip point vs. supply voltage, Vcc, to the circuit of FIG. 1.
Figure 6:
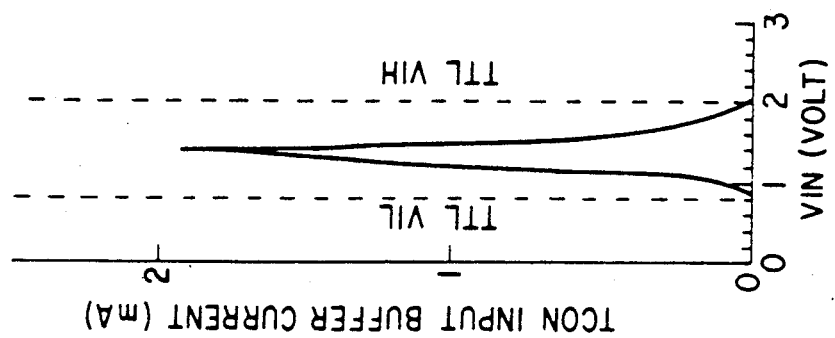
FIG. 6 is a plot of the current through an inverter in the TCON input buffer vs. buffer input voltage.
Figure 3:
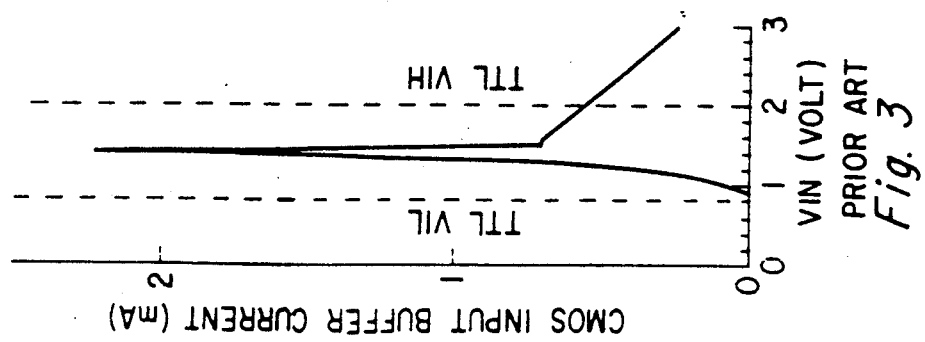
FIG. 3 is a plot of the current through an inverter in the prior art input buffer of FIG. 1 vs. inverter input voltage.

The operation of the input buffer shall now be explained with reference to FIG. 4. Starting with input buffer sub-circuit 1, transistor sizes of transistors 20 and 22 of inverter 18 are chosen such that the voltage at the source of transistor 20 is always at or below a voltage level of VTTLhi +Vtp where VTTLhi is the TTL logic high level of 2.0 volts and Vtp is the threshold voltage of p-channel transistor 20. FIG. 6 shows a plot of the buffer current through inverter 18 of the TCON input buffer vs. its input voltage at input 30 when the condition stated above is satisfied. The invention therefore allows reduced power dissipation of the buffer's first stage inverter 18 as evidenced by comparing the increased DC current of FIG. 3 in comparison with the DC current shown in FIG. 6. Note that the DC current in FIG. 6 is essentially zero when input voltage level at input 30 is held at a valid TTL level (shown here as 0.8 volts corresponding to logic low, TTLvl, and as 2.0 volts corresponding to a logic high, TTLvh). This important zero DC current feature allows the standby to active enabling signal as shown in FIG. 1 to be omitted from the input buffer. The elimination of this enabling signal allows faster speed operation because the output of the buffer is in a correct logic state during the standby period. Current through resistor 8, which is due to crowbar current (current through an inverter during switching) through first stage inverter 18, is converted into a voltage glitch by resistor 8 and received by transistor 10. Transistor 10 applies a voltage one base to emitter voltage drop (Vbe) below the voltage at its base to in effect transfer the glitch to the source of transistor 16. This reduces the gate to source voltage (Vgs) of transistor 16 and thus helps turn off transistor 16 in addition to the high logic level at the gate of transistor 16 which results after the transition from low to high at output 34 in response to a logic high to low transition at input 30. Therefore, by decreasing the voltage of the source of transistor 16 and increasing the voltage at transistor 16's gate, the effective gate source voltage, Vgs, is reduced faster than by increasing transistor 16's gate voltage while keeping its source voltage constant. Second stage inverter 24 receives the logic high level from output 34 of inverter 18 and applies a logic low from its output 26 to the gate of P-channel transistor 14, thus turning transistor 14 on. Therefore, transistor 14 latches the input to second stage inverter 24 up to Vcc, thereby eliminating any DC current through inverter 24.

Transition of voltage from a logic low to high at input 30 results in a transition from logic high to low at the input of inverter 24. Inverter 32 applies a high voltage to the base of bipolar transistor 12 prior to the logic high voltage at its input to effectively remove the feed forward voltage glitch from resistor 8 to allow transistor 16 to turn on through attainment of its full gate to source potential.

Threshold reference circuit 4 sets the trip point of input buffer sub-circuit. Operational amplifier (op amp) 36 adjusts the voltage at node B to keep the voltage at inverting input (−) equal to voltage at non-inverting input (+). BiCMOS band-gap reference circuit 2 delivers a substantially power supply, temperature independent voltage of approximately 1.4 volts to non-inverting input (+). Output VTH of threshold reference circuit 4 provides a regulated voltage to input buffer sub-circuit 1.

Figure 7:
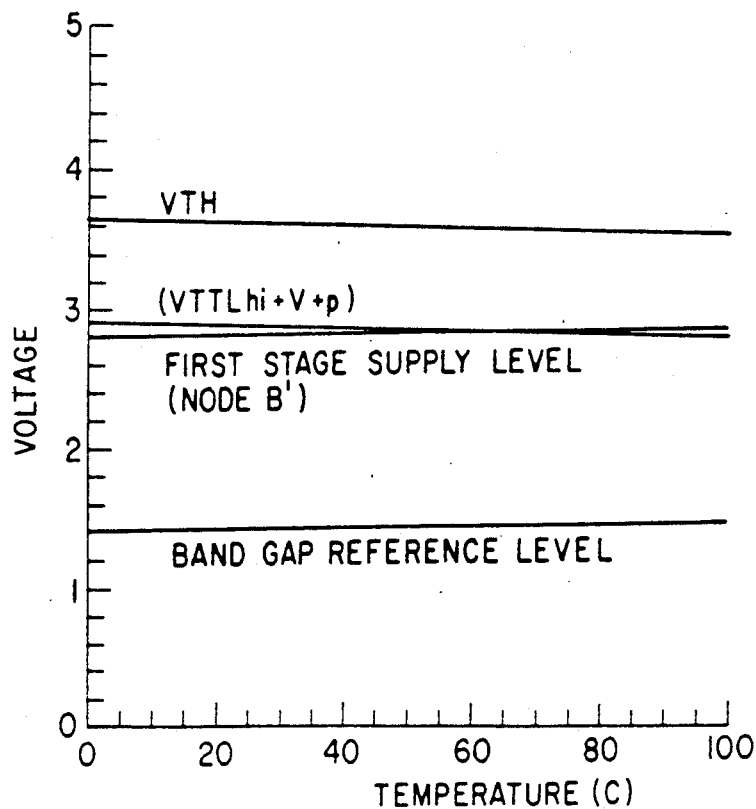
FIG. 7 is a plot of voltage vs. temperature for node B', the band-gap reference level, VTH, and VTTLhi +Vtp.

The darlington pair configuration of transistors 44 and 46 provides sufficient current to threshold reference inverter 48 in addition to providing a feedback path from the base of transistor 44 to inverting input (−) so as to place differential amplifier 36 in a voltage follower configuration with unity gain. A trip point voltage level for inverter 48 is attained by shorting its input to its output 54. Pole splitting capacitor 58, stabilizes threshold reference circuit 4 and thus prevents threshold reference circuit oscillation. The trip point of inverter 48 is controlled by controlling the voltage to non-inverting input (+) due to the voltage follower, unity gain configuration of differential amplifier 36 since this type of differential amplifier configuration constrains that inverting input (−) is maintained at the same voltage level as non-inverting input (+). The base of transistor 46 is connected to the base of transistor 6 and transistor 6 and 46 are identical. Thus, the voltage at the source of transistor 20, node B″, will equal the voltage at the drain of transistor 50, or rather node B. Additionally, the source of transistor 52 is maintained at the same voltage as the source of transistor 22, both shown at circuit ground. Therefore, since the drain and source voltages of the above transistors are the same and also assuming that inverters 18 and 48 are equally sized, the trip points of inverters 18 and 48 are the same. Thus, the invention achieves control over the trip point of first stage inverter 18 and results in reduced trip point variation across power supply, process and temperature as shown in FIG. 7 which illustrates voltage variations of the first stage supply level (node B'), band-gap reference level, and VTTLhi+Vtp level. FIG. 7 shows that the band-gap reference circuit 2 of FIG. 5 keeps the variation of the band-gap reference level to less 0.4% across a power supply range from 4 to 6 volts and it additionally illustrates the stable behavior characteristics of the band-gap reference voltage and the response of the VTH signal over temperature variations. The regulated voltage supplied to the first stage inverter 18 of FIG. 4 is kept near the VTTLhi+Vtp level to minimize DC current.

Referring back to FIG. 4, in order to insure that the voltage at inverting input (−) is maintained and that as a consequence node B adjusts itself in voltage properly, transistors 56 and 60 and resistor 62 provide a pull-down circuit for the base of transistor 46. Note that node B' equals node B and that transistors 56 and 60 mirror the current through inverter 48.

Trip point variation is further minimized by band-gap reference circuit 2 of FIG. 4.

The operation of band-gap reference circuit 2 of FIG. 4 will be explained with reference to FIG. 5. A first equilibrium state for the circuit exists when the power supply voltage is at zero. In this state, there is no current flowing in the circuit. However, when the power supply voltage is increased from zero, p-channel transistors 176 and 144 comprise a start-up sub-circuit wherein p-channel transistor 144 turns on due to the low potential at its gate through resistor 148. A current path is therefore provided from Vcc to the base of bipolar transistor 158. Note that the start-up circuitry can alternatively include bipolar transistors.

Transistor 158 provides current to a bandgap reference voltage sub-circuit. A reference voltage at output 162 is provided which equals (ΔVbe160−152)X +Vbe160 where ΔVbe160−152 is the difference between the base-emitter drop of transistors 160 and 152, X equals the ratio of the value of resistor 156 (which equals the value of resistor 168) over the value of resistor 154, and Vbe160 is the base-emitter drop of transistor 160. The above values are obtained by noting that transistor 184 is connected at its base to the collector of transistor 152. Furthermore, note that in this preferred embodiment the size of transistor 184 is the same size as transistor 160, which constrains the base-emitter voltages of transistors 160 and 184 to be the same and the voltages at nodes BB, and CC to be equal. Note, however, that the only and that therefore they are only one set of many possibilities.

The reference voltage at output 162 biases the base of transistor 164, turning on p-channel transistor 172 by causing its gate to drop in voltage due to the connection of the drain of transistor 172 with its own gate and with the collector of transistor 164. P-channel transistor 170 is preferably the same size as p-channel transistor 172. Current 180 flows through transistor 172 which, neglecting base currents, is equal to the reference voltage at output 162 minus the base-emitter drop of transistor 164, all divided by the value of resistor 166 which is connected to the emitter of transistor 164. Current 180 through transistor 172 mirrors and flows through transistor 170 (meaning current equal in value or functionally related to current 180 flows through transistor 170) while p-channel transistor 176 shuts transistor 144 off by pulling node FF up in voltage. Current 180 provides a reference current which is independent of power supply variations within a specified range (typically ranging from 4 to 6 volts) for the band-gap reference circuit. Reference current 180 is a function of the reference voltage at output 162, and allows the output of the band-gap circuit to control it input. Note that circuitry including bipolar transistors could perform the current mirroring function described above.

At the time transistor 144 is turned off, the start-up sub-circuit comprising transistors 144 and 176 is effectively removed from the band-gap circuit thereby allowing a second circuit equilibrium state for the band-gap circuit to exist. Mirrored current 180 flows through diode configured transistor 182 and into the collector of error feedback amplifier bipolar transistor 184. In this second equilibrium state, a decrease in voltage at the base of transistor 184 causes an increase in voltage at the base of transistor 158 so as to raise back up the voltage at the base of transistor 184 and thus maintain a constant output voltage. Additionally, an increase in voltage at the base of transistor 184 correspondingly causes a decrease in voltage at the base of transistor 184, thereby maintaining the reference voltage at output 162. The circuit just described and shown in Figure is virtually independent of variations in the supply voltage to the extent of supply voltage variations equal to approximately Vref+the base-emitter drop of transistor 58+the threshold voltage of transistor 72 or assuming typical values for each of the foregoing, 3.1 volts.

For stability purposes, MOS capacitors 100 may be inserted between the collector and the emitter of transistor 184 and between the base and emitter of transistor 184. Additionally, a capacitor across output 162 and circuit ground also benefits circuit stability.

Figure 8:
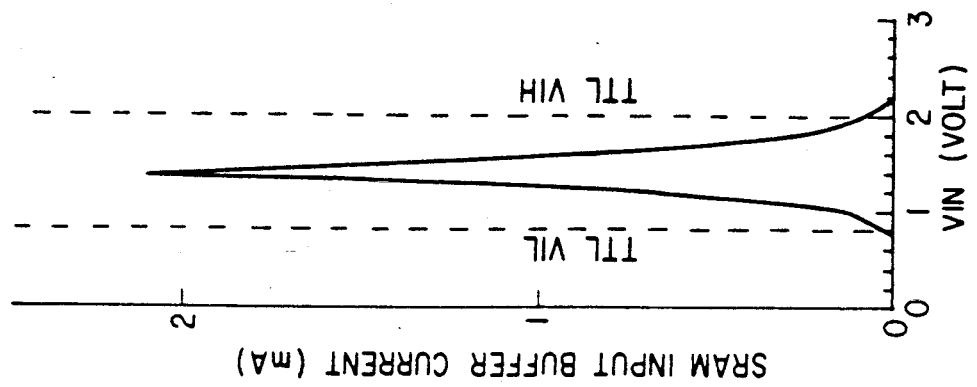
FIG. 8 is a plot illustrating an experimental SRAM's inverter current of an input buffer vs. the inverter' input voltage.

The TCON input buffer described above is implemented, for instance in a 16K BiCMOS TTL I/O (input/output)SRAM (static random access memory). For instance it is to be used at the address memory locations at an address buffer. The TCON input buffer is fabricated in a high performance 0.8 um BiCMOS process. The SRAM is typically 140% shrink of the 0.8 um layout rule design, and the smallest geometry size as patterned is 1.12 um. An experimental SRAM incorporating the invention had an access time measured at 8 ns, and the standby current was 8 ma. Current of an inverter vs. inverter input voltage of an inverter of a TCON input buffer incorporated in an experimental SRAM is shown in FIG. 8. The crowbar current at TTLvh (logic high) input level is 63 uA. This current is about 10% of the power consumption of a typical high speed CMOS input buffer which does not incorporate the present invention. The DC trip point (peak point on plot) is centered at 1.35 volts over voltage supply and temperature variations.

Although the invention has been described in detail, it is to be understood that this description is by way of example only, and is not to be construed in a limiting sense. It is to be further understood that numerous changes in the details of the embodiments of the invention, and additional embodiments of the invention, will be apparent to and may be made by persons of ordinary skill in the art having reference to this description. It is contemplated that all such changes and additions are within the spirit and true scope of the invention as claimed below. Accordingly, the invention is intended to be limited only by the scope of the appended claims.

I claim:

1. A circuit comprising:
   an operational amplifier;
   a threshold inverter coupled to said operational amplifier;
   a first stage inverter;
   a control circuit coupling said threshold inverter to said first stage inverter, whereby said first stage inverter receives a selected voltage, controlled by said control circuit, from said threshold inverter; and
   a second stage inverter coupled to said first stage inverter.

2. The circuit as recited in claim 1, wherein said control circuit comprises a current mirror.

3. The circuit as recited in claim 1, further comprising a band-gap reference circuit coupled to said operational amplifier.

* * * * *